(12) United States Patent
Campbell

(10) Patent No.: US 6,484,064 B1
(45) Date of Patent: Nov. 19, 2002

(54) METHOD AND APPARATUS FOR RUNNING METROLOGY STANDARD WAFER ROUTES FOR CROSS-FAB METROLOGY CALIBRATION

(75) Inventor: William Jarrett Campbell, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/412,472

(22) Filed: Oct. 5, 1999

(51) Int. Cl.$^7$ .............................................. G06F 19/00
(52) U.S. Cl. ...................... 700/100; 700/108; 700/121; 438/14
(58) Field of Search ................... 700/100, 97, 108–110, 700/121, 99, 102, 103, 111; 438/14; 702/81, 84, 85, 127

(56) References Cited

U.S. PATENT DOCUMENTS 5,862,055 A * 1/1999 Chen et al. ................. 700/121
6,255,125 B1 * 7/2001 Schmidt et al. ............... 438/14
6,277,658 B1 * 8/2001 Jeng et al. .................. 118/721
6,292,708 B1 * 9/2001 Allen et al. ................. 700/121

* cited by examiner

*Primary Examiner*—Leo Picard
*Assistant Examiner*—Steven R. Garland
(74) *Attorney, Agent, or Firm*—Williams, Morgan & Amerson, P.C.

(57) ABSTRACT

The present invention provides for a method and an apparatus for running metrology standard wafer routes for calibrating metrology data. A processing order for a run of semiconductor devices is determined. A metrology route based upon the processing order is determined. A metrology standard device is routed through the metrology route. Measurement data relating to the metrology standard device being routed though the metrology route is acquired. Metrology data processing upon the acquired measurement data is performed.

29 Claims, 6 Drawing Sheets

METHOD AND APPARATUS FOR RUNNING METROLOGY STANDARD WAFER ROUTES FOR CROSS-FAB METROLOGY CALIBRATION

BACKGROUND OF THE INVENTION

1. Field Of The Invention

This invention relates generally to manufacturing semiconductor products, and, more particularly, to a method and apparatus for performing wafer standard routing for cross-fab metrology calibration.

2. Description Of The Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the important aspects in semiconductor device manufacturing are RTA control, chemical-mechanical Planarization (CMP) control, and overlay control. Overlay is one of several important steps in the photolithography area of semiconductor manufacturing. Overlay control involves measuring the misalignment between two successive patterned layers on the surface of a semiconductor device. Generally, minimization of misalignment errors is important to ensure that the multiple layers of the semiconductor devices are connected and functional. As technology facilitates smaller critical dimensions for semiconductor devices, the need for reduced of misalignment errors increases dramatically.

Generally, photolithography engineers currently analyze the overlay errors a few times a month. The results from the analysis of the overlay errors are used to make updates to exposure tool settings manually. Some of the problems associated with the current methods include the fact that the exposure tool settings are only updated a few times a month. Furthermore, currently the exposure tool updates are performed manually.

Generally, a set of processing steps is performed on a lot of wafers on a semiconductor manufacturing tool called an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script, which can be a software program that automatically retrieves the data needed to execute a manufacturing process. Often, semiconductor devices are staged through multiple manufacturing tools for multiple processes, generating data relating to the quality of the processed semiconductor devices. Many times, inaccuracies in manufacturing processes cannot be measured because they may involve a semiconductor process characteristic that may be difficult to measure. This could cause quality problems that may otherwise be corrected if data relating to the inaccuracies had been acquired.

Furthermore, wafers that are processed in different location may carry metrology data associated with each process that was performed on a particular semiconductor wafer. Many times, one set of data associated with a particular metrology tool will not properly correspond with data from another metrology tool from a different manufacturing area. This could cause inherent bias or drift in the measurements made on a semiconductor wafer as it is being processed through various manufacturing areas.

The present invention is directed to overcoming, or at least reducing the effects of, one or more of the problems set forth above.

SUMMARY OF THE INVENTION

In one aspect of the present invention, a method is provided for running metrology standard wafer routes for calibrating metrology data. A processing order for a run of semiconductor devices is determined. A metrology route based upon the processing order is determined. A metrology standard device is routed through the metrology route. Measurement data relating to the metrology standard device being routed though the metrology route is acquired. Metrology data processing upon the acquired measurement data is performed.

In another aspect of the present invention, an apparatus is provided for running metrology standard wafer routes for calibrating metrology data. The apparatus of the present invention comprises: means for determining a processing order for a run of semiconductor devices; means for determining a metrology route based upon the processing order; means for routing a metrology standard device through the metrology route; means for acquiring measurement data relating to the metrology standard device being routed though the metrology route; and means for performing metrology data processing upon the acquired measurement data.

BRIEF DESCRIPTION OF THE DRAWINGS

The invention may be understood by reference to the following description taken in conjunction with the accompanying drawings, in which like reference numerals identify like elements, and in which.

Figure 1:
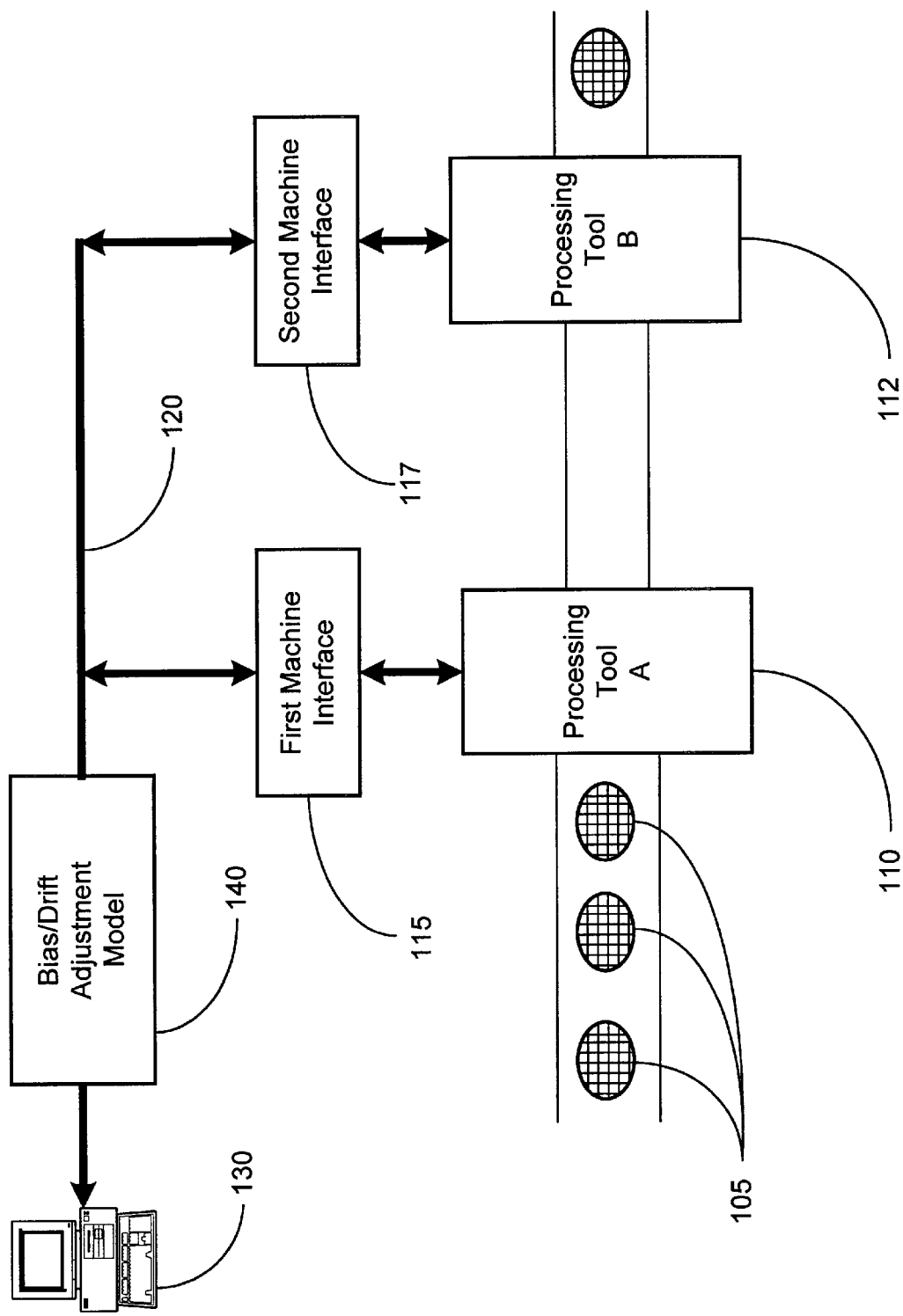
FIG. 1 illustrates one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discreet processes that are involved in semiconductor manufacturing. Many times, semiconductor devices are stepped through multiple manufacturing process tools. As semiconductor devices are processed through manufacturing tools, production data is generated. The production data can be used to perform fault detection analysis, which can lead to improved manufacturing results. Overlay process is an important group of process steps in semiconductor manufacturing. In particular, overlay process involves measuring misalignment errors between semiconductor layers during manufacturing processes. Improvements in the overlay process could result in substantial enhancements, in terms of quality and efficiency, in semiconductor manufacturing processes. The present invention provides a method of acquiring production data and performing fault model analysis in response to the acquired production data. The present invention also provides a method of performing adjustments for bias of process-related measurement data acquired from various manufacturing areas.

Turning now to FIG. 1, one embodiment of the present invention is illustrated. In one embodiment, semiconductor products 105, such as semiconductor wafers are processed on processing tools 110, 112 using a plurality of control input signals on a line 120. In one embodiment, the control input signals on the line 120 are sent to the processing tools 110, 112 from a computer system 130 via machine interfaces 115, 117. In one embodiment, the control input signals are generated by the computer system 130 utilizing a bias/drift adjustment model 140. In one embodiment, the bias/drift adjustment model 140 is used to measure the bias and drift in process-related measurement data acquired from various manufacturing areas. The bias and drift data is then used for calibration and adjustments for process variation to reduce and compensate for manufacturing errors. Furthermore, the bias and drift data can be used to perform modifications to control input signals on a run-to-run basis.

Run-to-run control in semiconductor manufacturing generally refers to using off-line or on-line metrology tools to measure some output parameters of a semiconductor manufacturing process. The measured output parameters of the semiconductor manufacturing are then used to make adjustment to a recipe, such as control input parameters, associated with a particular processing tool 110, 112. For instance, during the placement of a polish onto a semiconductor wafer during a chemical-mechanical polisher planarization process, one objective is to process a semiconductor wafer with a process film on it and polish down the process film such that the process film is relatively flat and has a predetermined thickness. Generally, after a processing tool 110, 112 polishes a semiconductor wafer, a metrology tool is utilized to measure the process film thickness on a variety of sites across the semiconductor wafer, to determine if a desired film thickness and uniformity has been achieved. The measurement of the film thickness and uniformity can be then used to adjust the control input parameters on the line 120 for the next run of semiconductor wafers.

In one embodiment, the first and second machine interfaces 115, 117 are located outside the processing tools 110, 112. In an alternative embodiment, the first and second machine interfaces 115, 117 are located within the processing tools 110, 112. In one embodiment, the computer system 130 sends control input signals on a line 120 to the first and second machine interfaces 115, 117. The control input signals on a line 120 that are intended for processing tool A 110 are received and processed by the first machine interface 115. The control input signals on a line 120 that are intended for processing tool B 112 are received and processed by the second machine interface 117. Examples of the processing tools 110, 112 used in semiconductor manufacturing processes are steppers.

For processing tools such as steppers, the control inputs, on the line 120, that are used to operate the processing tools 110, 112 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool. One of the primary features taught by the present invention is a method of detecting and organizing fault data for semiconductor manufacturing processes.

For photolithography processes, when a process step in a processing tool 110, 112 is concluded, the semiconductor product 105 or wafer that is being processed is examined in a review station. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs for a particular exposure process. The control inputs generally affect the accuracy of the process steps performed by the processing tools 110, 112 on the semiconductor wafer. Modifications of the control inputs can be utilized to improve the performance of the process steps employed in the manufacturing tool. Many times, the errors that are found in the processed semiconductor products 105 can be correlated to a particular fault analysis and corrective actions can be taken to reduce the errors.

Typically, run-to-run control operations on semiconductor processing has traditionally been isolated to run-to-run control processes. For example, during a chemical-mechanical polisher planarization process, measurements are taken before and after semiconductor wafers are polished. The measurements are then used to perform adjustments to control input parameters that control the chemical-mechanical polisher planarization process for the next run of semiconductor wafers.

More recently, centralized control of clusters of multiple manufacturing operations and processes are performed. In other words, a series of manufacturing processes that are interrelated are controlled by a centralized control system. For example, a semiconductor wafer is routed though an etching process, followed by a process film deposition process, followed by a polishing process, and onto a cleaning process. In one embodiment, the quality of the semiconductor wafer output product that comes from each of the four processes depends upon the operation of the other processes. For example, an error in the film deposition process may be corrected during the polishing process. A desirable attribute in semiconductor manufacturing is the ability to compensate by modifying a subsequent process when a prior process resulted in an error.

Generally, each one of the aforementioned interrelated processes are performed by different modules. Furthermore, a manufacturing facility, such as a fab, is divided into manufacturing groups that handle different process steps. One of the problems faced by the industry is that data measured in one manufacturing group may be used for calculating control input parameters for process tools 110, 112 in another manufacturing group. This problem is exacerbated by the fact that the measurement data that are used across manufacturing areas are used to determine high precision control parameters. In one embodiment, metrology tools are used to perform high precision measurements that are used across manufacturing areas.

To use measurement data across multiple manufacturing areas, processing tools 110, 112 are calibrated to a measurement standard. For example, processing tools 110, 112 that perform polishing processes are calibrated in relation to a corresponding metrology tool, and are calibrated in relation to other processing tools 110, 112 that perform etching processes calibrate their corresponding metrology tools. One problem that can occur is that metrology tools in one particular manufacturing area may be properly calibrated and matched to a particular measurement standard, but may be unmatched with a group of metrology tools in another manufacturing area. Many times, changes to the operation of the processing tools 110, 112 call for compensation and calibration of measurement data. Despite calibration of processing tools 110, 112 and metrology tools, bias or drifts of measurement data could occur between the processing tools 110, 112 and metrology tools. The bias in measurement data can compromise the effectiveness of the adjustments made to control input parameters during run-to-run control. The present invention provides a method to collect bias and drift data from multiple manufacturing points and compensate measurement data by using the bias and drift data for calculations.

Figure 2:
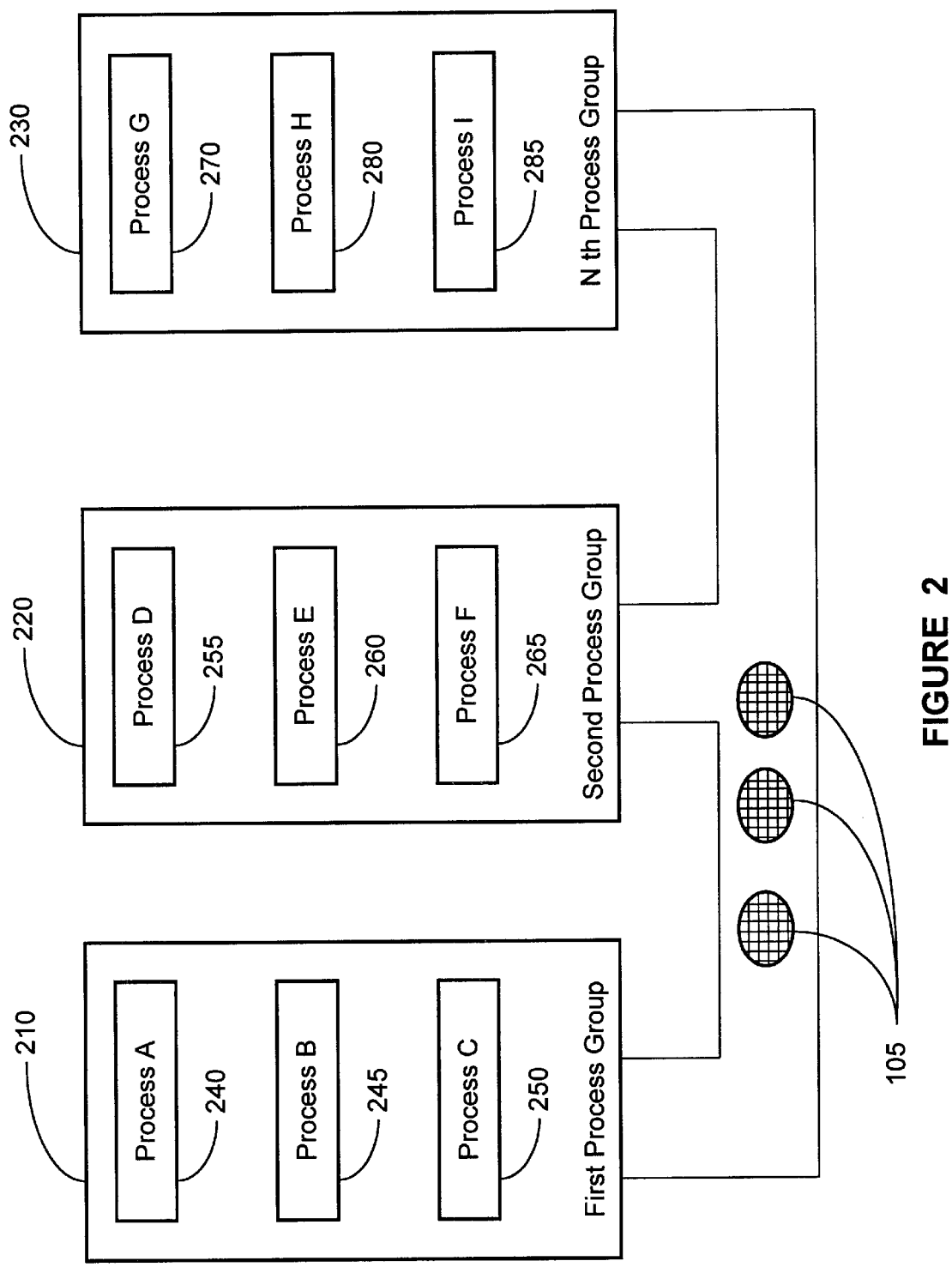
FIG. 2 illustrates a block diagram representation of one embodiment of multiple manufacturing processes associated with different process groups.

Turning now to FIG. 2, a block diagram representation of one embodiment of multiple manufacturing processes associated with different process groups 210, 220, 230 is illustrated. Process-A 240, process-B 245, and process-C 250 are located in the first process group 210. In one embodiment, process-A 240, process-B 245, and process-C 250 are film deposition processes. In one embodiment, semiconductor products 105 are processed through the multiple process film deposition processes in the first process group 210 and are routed to the second process group 220 for polishing processes.

In one embodiment, the second process group 220 is located in a different location of a manufacturing facility, such as a semiconductor fab. The second process group 220 comprises process-D 255, process-E 260, and process-F 265, which in one embodiment are polishing processes. When processing of the semiconductor products 105 is completed in the second process group 220, the semiconductor products 105 are routed to the Nth processing group 230 for cleaning processes. The Nth process group 230, which may be elsewhere in the manufacturing facility, comprises process-G 270, process-H 275, and process-I 280. In one embodiment, process-G 270, process-H 275, and process-I 280 are cleaning processes.

Figure 3:
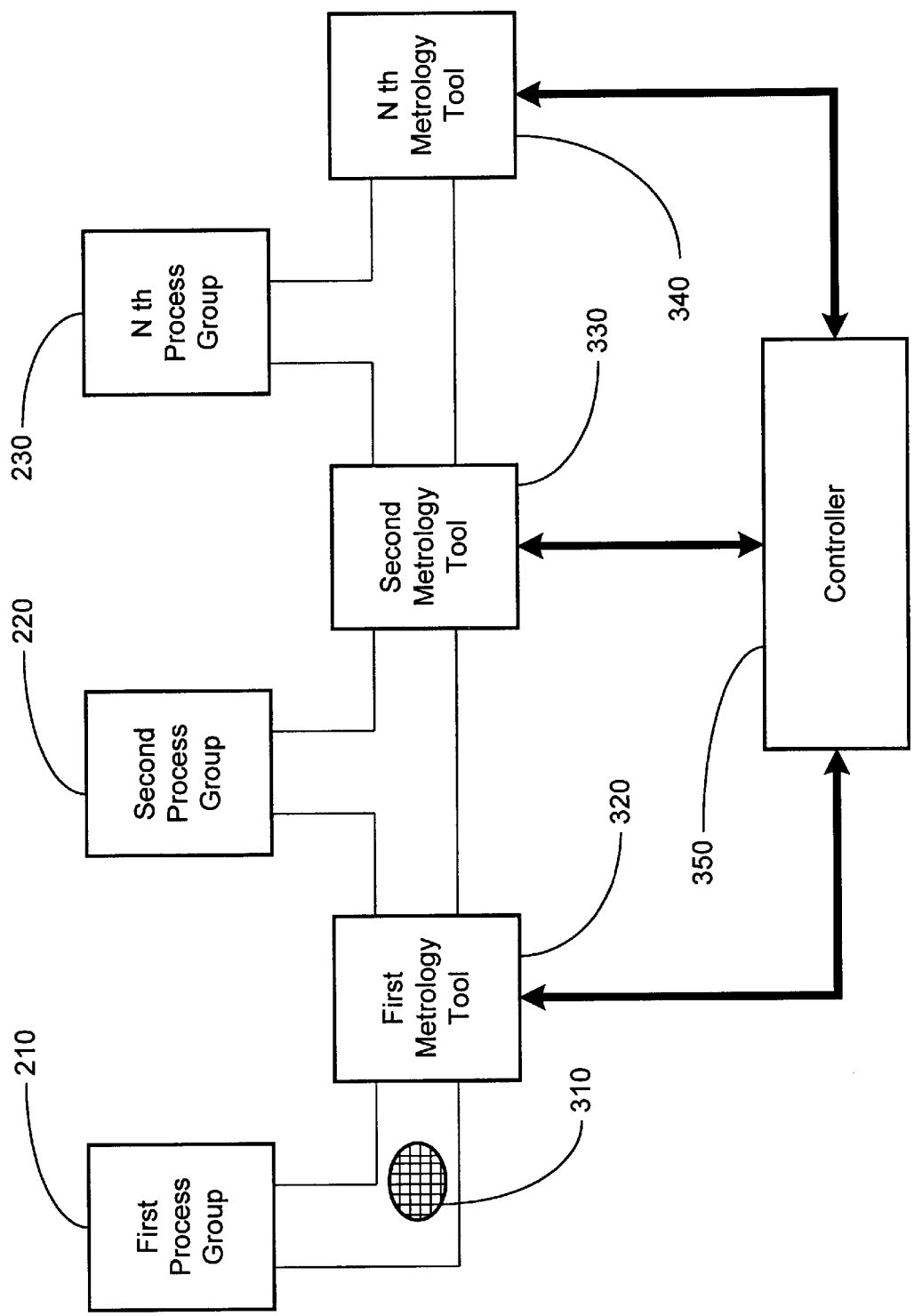
FIG. 3 illustrates a block diagram representation of one embodiment of a metrology route as a metrology standard device is routed through various process groups and metrology tools.

Data measurements from the process steps performed at the first through Nth process groups 210, 220, 230 are recorded for calibration purposes. Turning now to FIG. 3, a block diagram representation of one embodiment of a metrology route is illustrated. A metrology standard device 310 is routed through the first through Nth process groups 210, 220, 230. In one embodiment, the metrology standard device 310 is a semiconductor wafer. In one embodiment, the metrology standard device 310 is routed through a manufacturing area just as a production semiconductor wafer is routed, called a metrology route. In one embodiment, the metrology standard device 310 is not processed but is routed through all of the processing steps that a production semiconductor wafer would experience. In other words, the metrology standard device 310 travels in the same manner as the routing of production semiconductor wafers. In one embodiment the metrology standard device 310 is continuously routed through the metrology route. The primary usage of the metrology standard device 310 is for measurement purposes at each process location.

Associated with the first through Nth process groups 210, 220, 230 are the first, through Nth metrology tools 320, 330, 340, respectively. After completion of the film deposition processes in the first process group 210, the metrology standard device 310 is routed to the first metrology tool 320 for process data measurement. Measurement data from the first metrology tool 320 is sent to the controller 350 for processing. Similarly, the metrology standard device 310 is routed through the second process group 220, the second metrology tool 330, and to the Nth process group 230 and Nth metrology tool 340. Measurement data from the metrology tools 320, 330, 340 is sent to the controller. As the metrology standard device 310 is routed through the process groups 210, 220, 230 and the metrology tools 320, 330, 340, the controller 350 acquires data regarding the repeatability of the data measurement across the various processes in the process groups 210, 220, 230.

Figure 4:
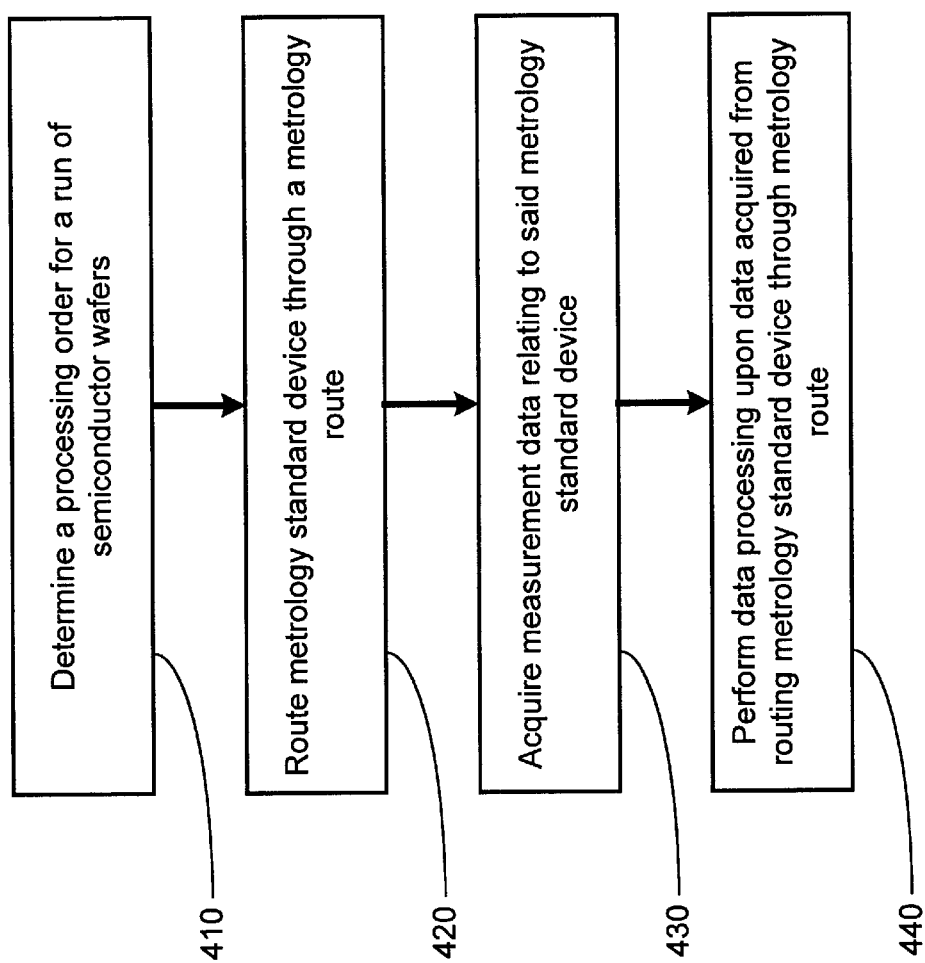
FIG. 4 illustrates a flowchart representation of one embodiment of the method for routing a metrology standard device, as taught by the present invention.

Turning now to FIG. 4, a flowchart representation of one embodiment of the method for routing a metrology standard device 310, as taught by the present invention, is illustrated. A processing order for a run of semiconductor wafers is determined for developing a metrology route, as described in block 410 of FIG. 4. A metrology standard device 310 is passed though the metrology route, as described in block 420 of FIG. 4. In one embodiment, the metrology route corresponds to a route that is used for processing production semiconductor wafers. In one embodiment, the metrology standard device 310 is continuously routed from one process module to another, effectively being routed in closed loop patterns.

As the metrology standard device 310 is passed through the metrology route, measurement data is acquired by the controller 350, as described in block 430 of FIG. 4. In one embodiment, the controller 350 is capable of tracking measurement data for a particular lot of semiconductor wafers. The controller 350 can also track the measurement data relating to the metrology standard device 310 as the metrology standard device 310 is routed throughout a manufacturing facility. Metrology data processing is performed upon the data acquired from routing the metrology standard device 310 through the metrology route, as described in block 440 of FIG. 4. One embodiment of a more detailed illustration of the metrology data processing described in block 440 of FIG. 4 is illustrated in FIG. 5.

Figure 5:
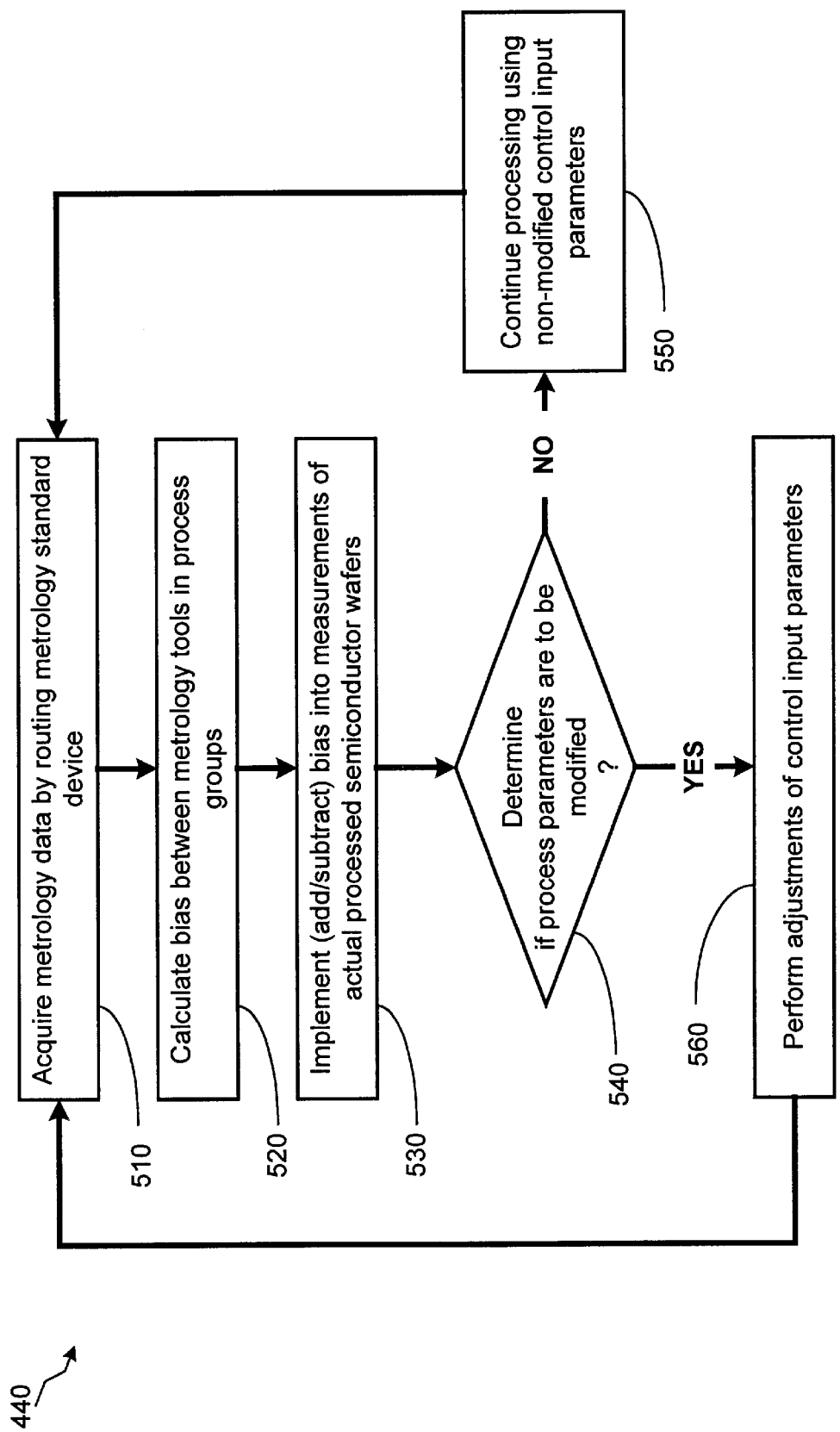
FIG. 5 depicts a more detailed illustration of the step of performing data processing upon data acquired from routing a metrology standard device through a metrology route, described in FIG. 4.

Turning now to FIG. 5, metrology data from routing the metrology standard device 310 is acquired by the controller 350, which in one embodiment is an APC controller, as described in block 510. In one embodiment, a controller tracks metrology data as the metrology standard device 310 progresses throughout the metrology route and calculates a bias or a drift in the measurements corresponding to different metrology tools within process groups 210, 220, 230, as described in block 520 of FIG. 5. Once data relating to a bias or a drift between different process groups 210, 220, 230 are calculated, the bias and drift data are implemented into the metrology measurements of actual production semiconductor wafers, as described in block 530 of FIG. 5. Bias and drift data are added or subtracted from metrology data to compensate for bias and drift between process groups 210, 220, 230. In an alternative embodiment, metrology tools used in semiconductor manufacturing are calibrated to each other. When calibration of metrology tools does not produce manufacturing results that are in acceptable tolerances, bias and drift data is used to compensate for irregular metrology data. In one embodiment, correlation data, which includes non-linear results from manufacturing, is used to compensate for irregular metrology data.

Based upon the calculation of metrology measurements and bias and drift data, the controller 350 determines if control input parameters on the line 120 are to be modified, as described in block 540 of FIG. 5. In one embodiment, the determination of modifying control input parameters on the line 120 is made by a controller 350 that is a run-to-run controller 350. When a determination is made that control input parameters on the line 120 need not be modified, the existing control parameters are used and the step of acquiring metrology data by routing the metrology standard device 310 is repeated, as described in block 550 of FIG. 5. When a determination is made that control input parameters are to be modified, adjustments to the control input parameters are made based upon the error data acquired by the controller 350, as described in block 560 of FIG. 5. A more detailed illustration of the step of performing adjustments of control input parameters, described in block 560 of FIG. 5, is illustrated in FIG. 6.

Figure 6:
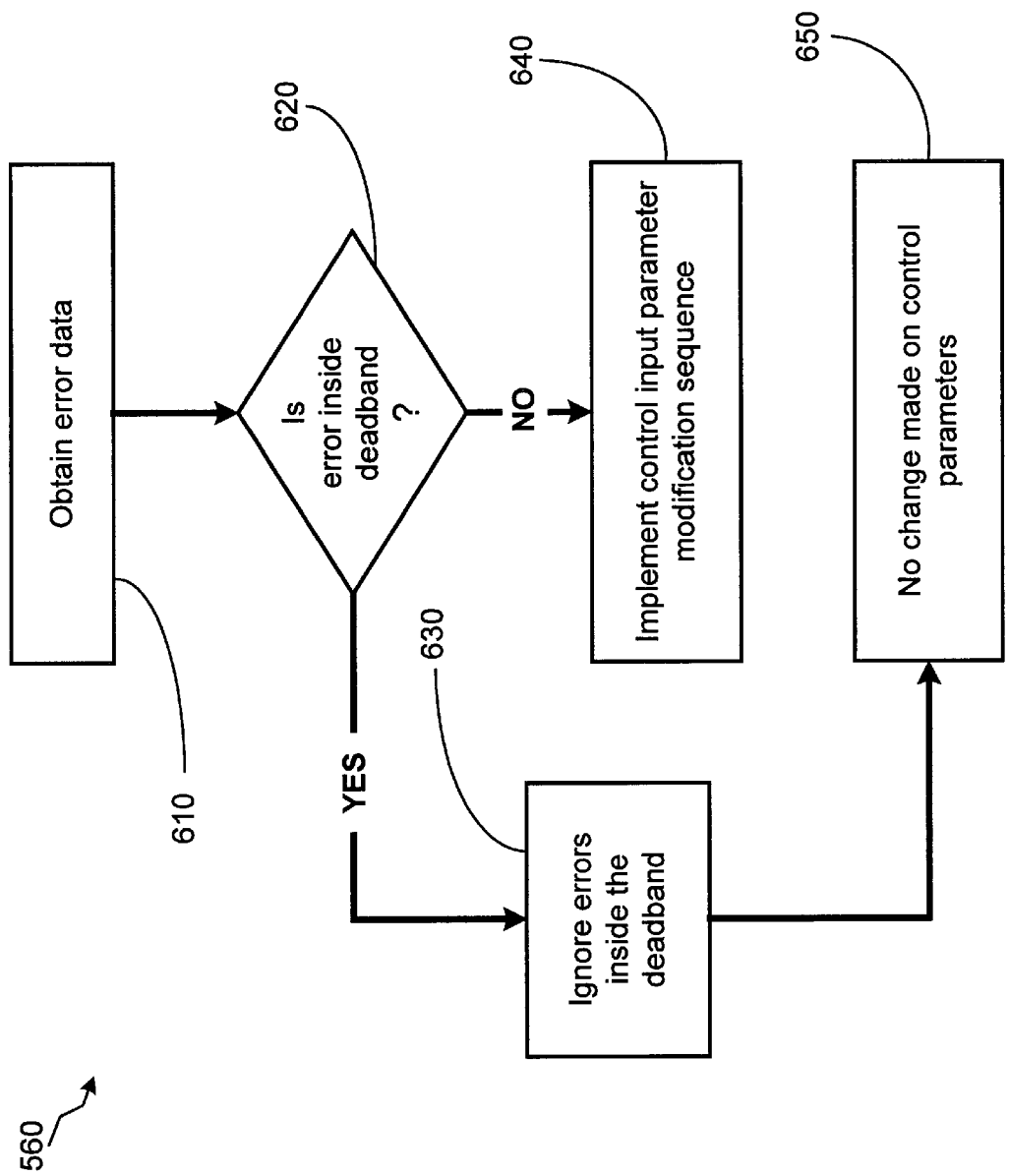
FIG. 6 depicts a more detailed illustration of the step of performing adjustments of control input parameters, described in FIG. 5.

Turning now to FIG. 6, error data relating to processing of semiconductor devices is acquired, as described in block 610. In one embodiment, error data is acquired using the step of calculating errors and modification factors for control input parameters described in FIG. 5. Turning back to FIG. 4, once the error data is acquired, a determination is made whether the error data is inside the deadband, as described in block 620 of FIG. 6. The step described in block 620 is performed to determine whether an error is sufficiently significant to warrant a change in the control inputs on the line 120. To define the deadband, the errors acquired from product analysis stations (not shown), such as the review station, are compared to a predetermined set of threshold parameters. On method of determining the deadband is to base the deadband to the precision of the metrology tool. In other words, if an error is smaller than the minimum precision of the metrology tool, then that error is considered to be in the deadband. In one embodiment, the deadband contains a range of error values associated with control input signals centered proximate to a set of corresponding predetermined target values, for which generally controller action is blocked. If any one of the errors acquired from the product analysis station is smaller than its corresponding predetermined threshold value, that particular error is deemed to be in the deadband. One of the primary purposes of the deadband is to prevent excessive control actions, resulting from changes to control input signals on the line 120, from causing a semiconductor manufacturing process to be inordinately jittery.

When a determination is made, as shown in block 620, that an error corresponding to a control input signal is inside the deadband, that particular error is ignored, as described in block 630 of FIG. 6. Therefore, when the value of an error that corresponds to a control input signal is found to be in the predetermined deadband, that particular error is not used to update its corresponding control input signal. New error data is then obtained and analyzed, as described in block 640 of FIG. 6. In one embodiment, the steps described above are repeated for the new error data that is obtained.

When a determination is made, as shown in block 620, that an error corresponding to a control input signal is not inside the deadband, further processing, such as implementing a control input parameter modification sequence, is performed, as described in block 650 of FIG. 6. The value of the error corresponding to a control input signal is used to update that control input parameter on the line 120 for a subsequent manufacturing process step.

The principles taught by the present invention can be implemented in an Advanced Process Control (APC) Framework. The APC is a preferred platform from which to implement the overlay control strategy taught by the present invention. In some embodiments, the APC can be a factorywide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for running metrology standard wafer routes for calibrating metrology data, comprising:

determining a processing order for a run of semiconductor devices;

determining a metrology route based upon said processing order;

routing a metrology standard device through said metrology route, said metrology route comprising a plurality of metrology tools;

acquiring measurement data relating to said metrology standard device being routed though said metrology route; and performing metrology data processing upon said acquired measurement data, performing said metrology data processing comprising determining a bias between said metrology tools.

2. The method described in claim 1, wherein determining a processing order for a run of semiconductor devices further comprises determining an order of routing a semiconductor device though a plurality of process groups.

3. The method described in claim 1, wherein determining a processing order for a run of semiconductor devices further comprises determining a processing order for a run of semiconductor wafers.

4. The method described in claim 1, wherein determining a metrology route based upon said processing order further comprises determining a metrology route that is substantially similar to a predetermined route for processing a production semiconductor wafer.

5. The method described in claim 1, wherein routing a metrology standard device through said metrology route further comprises routing a metrology standard semiconductor wafer through said metrology route.

6. The method described in claim 1, wherein routing a metrology standard device through said metrology route further comprises routing said metrology standard device through a metrology tool corresponding to each processing tool.

7. The method described in claim 1, wherein routing a metrology standard device through said metrology route further comprises routing said metrology standard device continuously throughout said metrology route.

8. The method described in claim 1, wherein acquiring measurement data relating to said metrology standard device being routed though said metrology route further comprises acquiring metrology data using a metrology tool.

9. The method described in claim 1, wherein performing metrology data processing upon said acquired measurement data further comprises:

acquiring metrology data relating to said metrology standard device by routing said metrology standard device though said metrology route;

calculating a bias data between at least two metrology tools within a process group using said acquired metrology data relating to said metrology standard device;

calculating a drift data between at least two process groups using said acquired metrology data relating to said metrology standard device;

acquiring metrology data relating to processing of at least one semiconductor wafer;

implementing said bias data and said drift data into said metrology data relating to processing of said semiconductor wafer;

determining whether at least one control input parameter is to be modified based upon said implementation of said bias data and said drift data into said metrology data; and performing an adjustment of said control input parameter based upon said determination that at least one control input parameter is to be modified.

10. The method described in claim 9, wherein acquiring metrology data relating to said metrology standard device further comprises routing said metrology standard device through at least one processing tool and at least one metrology tool corresponding to said processing tool used for semiconductor manufacturing.

11. The method described in claim 9, wherein implementing said bias data and said drift data into said metrology data relating to processing of said semiconductor wafer further comprises adding a bias data value and said drift data value to said metrology data relating to processing of said semiconductor wafer.

12. The method described in claim 11, wherein implementing said bias data and said drift data into said metrology data relating to processing of said semiconductor wafer further comprises subtracting a bias data value and said drift data value from said metrology data relating to processing of said semiconductor wafer.

13. The method described in claim 12, wherein implementing said bias data and said drift data into said metrology data relating to processing of said semiconductor wafer further comprises implementing a correlation data into said metrology data relating to processing of said semiconductor wafer.

14. The method described in claim 9, wherein performing an adjustment of said control input parameter based upon said determination that at least one control input parameter is to be modified further comprises performing an adjustment of said control input parameter on a run-to-run basis.

15. An apparatus for running metrology standard wafer routes for calibrating metrology data, comprising:

means for determining a processing order for a run of semiconductor devices;

means for determining a metrology route based upon said processing order;

means for routing a metrology standard device through said metrology route, said metrology route comprising a plurality of metrology tools;

means for acquiring measurement data relating to said metrology standard device being routed though said metrology route; and means for performing metrology data processing upon said acquired measurement data, performing said metrology data processing comprising determining a bias between said metrology tools.

16. A computer readable program storage device encoded with instructions that, when executed by a computer, performs a method for running metrology standard wafer routes for calibrating metrology data, comprising:

determining a processing order for a run of semiconductor devices;

determining a metrology route based upon said processing order;

routing a metrology standard device through said metrology route, said metrology route comprising a plurality of metrology tools;

acquiring measurement data relating to said metrology standard device being routed though said metrology route; and performing metrology data processing upon said acquired measurement data, performing said metrology data processing comprising determining a bias between said metrology tools.

17. The computer readable program storage device encoded with instructions that, when executed by a computer, performs the method described in claim 16, wherein determining a processing order for a run of semiconductor devices further comprises determining an order of routing a semiconductor device though a plurality of process groups.

18. The computer readable program storage device encoded with instructions that, when executed by a computer, performs the method described in claim 16, wherein determining a processing order for a run of semiconductor devices further comprises determining a processing order for a run of semiconductor wafers.

19. The computer readable program storage device encoded with instructions that, when executed by a computer, performs the method described in claim 16, wherein determining a metrology route based upon said processing order further comprises determining a metrology route that is substantially similar to a predetermined route for processing a production semiconductor wafer.

20. The computer readable program storage device encoded with instructions that, when executed by a computer, performs the method described in claim 16, wherein routing a metrology standard device through said metrology route further comprises routing a metrology standard semiconductor wafer through said metrology route.

21. The computer readable program storage device encoded with instructions that, when executed by a computer, performs the method described in claim 16, wherein routing a metrology standard device through said metrology route further comprises routing said metrology standard device through a metrology tool corresponding to each processing tool.

22. The computer readable program storage device encoded with instructions that, when executed by a computer, performs the method described in claim 16, wherein routing a metrology standard device through said metrology route further comprises routing said metrology standard device continuously throughout said metrology route.

23. The computer readable program storage device encoded with instructions that, when executed by a computer, performs the method described in claim 16, wherein acquiring measurement data relating to said metrology standard device being routed though said metrology route further comprises acquiring metrology data using a metrology tool.

24. The computer readable program storage device encoded with instructions that, when executed by a computer, performs the method described in claim 16, wherein performing metrology data processing upon said acquired measurement data further comprises:

acquiring metrology data relating to said metrology standard device by routing said metrology standard device though said metrology route;

calculating a bias data between at least two process groups using said acquired metrology data relating to said metrology standard device;

calculating a bias data between at least two metrology tools within a process group using said acquired metrology data relating to said metrology standard device;

acquiring metrology data relating to processing of at least one semiconductor wafer;

implementing said bias data and said drift data into said metrology data relating to processing of said semiconductor wafer;

determining whether at least one control input parameter is to be modified based upon said implementation of said bias data and said drift data into said metrology data; and performing adjustments of said control input parameters based upon said determination that at least one control input parameter is to be modified.

25. The computer readable program storage device encoded with instructions that, when executed by a computer, performs the method described in claim 24, wherein acquiring metrology data relating to said metrology standard device further comprises routing said metrology standard device through at least one processing tool and at least one metrology tool corresponding to said processing tool used for semiconductor manufacturing.

26. The computer readable program storage device encoded with instructions that, when executed by a computer, performs the method described in claim 24, wherein implementing said bias data and said drift data into said metrology data relating to processing of said semiconductor wafer further comprises adding a bias data value and said drift data value to said metrology data relating to processing of said semiconductor wafer.

27. The computer readable program storage device encoded with instructions that, when executed by a computer, performs the method described in claim 24, wherein implementing said bias data and said drift data into said metrology data relating to processing of said semiconductor wafer further comprises subtracting a bias data value and said drift data value from said metrology data relating to processing of said semiconductor wafer.

28. The computer readable program storage device encoded with instructions that, when executed by a computer, performs the method described in claim 27, wherein implementing said bias data and said drift data into said metrology data relating to processing of said semiconductor wafer further comprises implementing a correlation data into said metrology data relating to processing of said semiconductor wafer.

29. The computer readable program storage device encoded with instructions that, when executed by a computer, performs the method described in claim 24, wherein performing adjustments of said control input parameters based upon said determination that at least one control input parameter is to be modified further comprises performing adjustments of said control input parameters on a run-to-run basis.

* * * * *